United States Patent
Heinz

(10) Patent No.: US 6,411,018 B1
(45) Date of Patent: Jun. 25, 2002

(54) PIEZOELECTRIC ACTUATOR WITH IMPROVED ELECTRODE CONNECTIONS

(75) Inventor: Rudolf Heinz, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/763,256

(22) PCT Filed: May 26, 2000

(86) PCT No.: PCT/DE00/01718

§ 371 (c)(1),
(2), (4) Date: Mar. 30, 2001

(87) PCT Pub. No.: WO00/79607

PCT Pub. Date: Dec. 28, 2000

(30) Foreign Application Priority Data

Jun. 19, 1999 (DE) .......................... 199 28 189

(51) Int. Cl.$^7$ .............................................. H01L 41/04
(52) U.S. Cl. ........................................ 310/363; 310/365
(58) Field of Search ................................ 310/365, 366, 310/363, 364, 328

(56) References Cited

U.S. PATENT DOCUMENTS

| | | | | | |
|---|---|---|---|---|---|
| 4,012,588 | A | * | 3/1977 | Davis et al. ................... | 178/18 |
| 5,438,232 | A | * | 8/1995 | Inoue et al. ................ | 310/328 |
| 5,459,371 | A | * | 10/1995 | Okawa et al. .............. | 310/363 |
| 6,104,129 | A | * | 8/2000 | Okamoto .................... | 310/366 |
| 6,191,522 | B1 | * | 2/2001 | Reuter ........................ | 310/328 |
| 6,208,026 | B1 | * | 3/2001 | Bindig et al. ............... | 257/718 |
| 6,236,146 | B1 | * | 5/2001 | Cramer et al. .............. | 310/366 |
| 6,291,929 | B1 | * | 9/2001 | Heinz et al. ................ | 310/328 |

FOREIGN PATENT DOCUMENTS

| | | | |
|---|---|---|---|
| DE | 33 30 538 A1 | * | 3/1985 |
| DE | 197 15 488 C1 | * | 6/1998 |
| DE | 197 15 488 C | | 6/1998 |
| EP | 0 844 678 A | | 5/1998 |
| EP | 0 844 678 A1 | * | 5/1998 |

OTHER PUBLICATIONS

Patent Abstract of Japan 08250777 A, Sep. 27, 1996.*
Patens Abstracts of Japan, E–1271 Sep. 29, 1992, vol. 16/No. 469.*
Patant Abstracts of Japan 07226541 A, Aug. 22, 1995.
Patent Abstracts of Japan vol. 1999, No. 01, Jan. 29, 1999 & JP 10 284763 A, Oct. 23, 1998.
Patent Abstract of Japan vol. 011, No. 127 (E–501), Apr. 21, 1987 & JP 61 272984 A, Dec. 3, 1986.
Patent Abstracts of Japan vol. 008, No. 264 (E–282) Dec. 4, 1984 & JP 59 135784 A, Aug. 4, 1984.
Patent Abstract of Japan vol. 1997, No. 01 Jan. 31, 1997 & JP 08 236828 ,A Sep. 13, 1996.

* cited by examiner

*Primary Examiner*—Nestor Ramirez
*Assistant Examiner*—Peter Medley
(74) *Attorney, Agent, or Firm*—Michael J. Striker

(57) ABSTRACT

A piezoelectric actuator, for example for actuating a mechanical component, is proposed, which has a multilayered structure of piezoelectric layers and internal electrodes (2, 3) disposed between them. As a conductive surface, a first external electrode (6) is mounted on a respective side surface and is contacted by the respective internal electrodes (2, 3). An elastic contact is used to supply electrical voltage by means of connections (4, 5; 15) to a second net-like or woven cloth-like external electrode (7), which is disposed on the first external electrode (6). The second external electrode is contacted by the first one (6) at least at points and also has expandable regions in the vicinity of the contact surface or contact points (8; 14; 17)

8 Claims, 3 Drawing Sheets

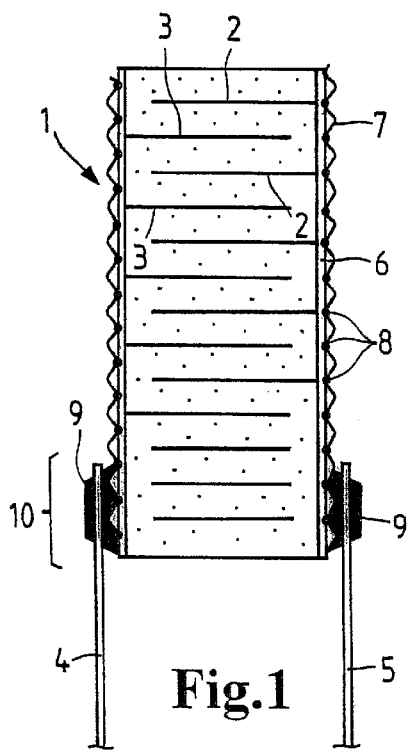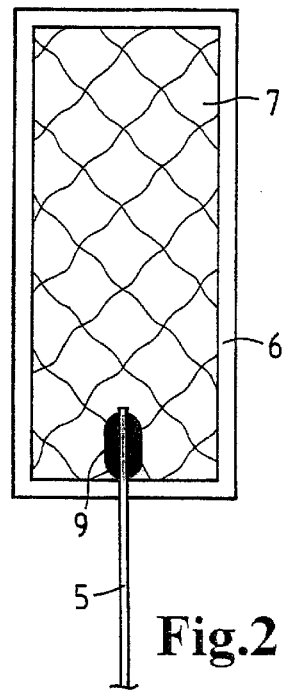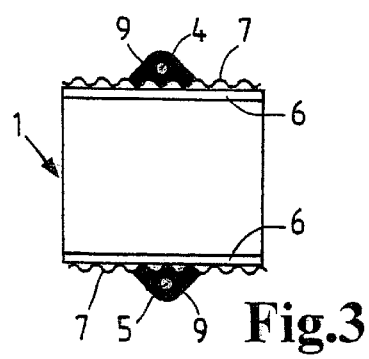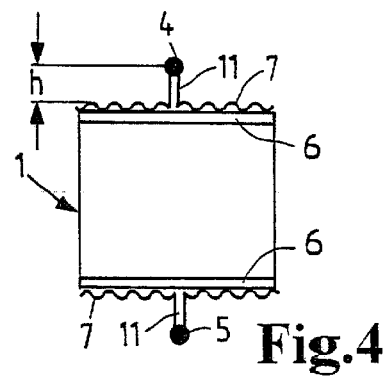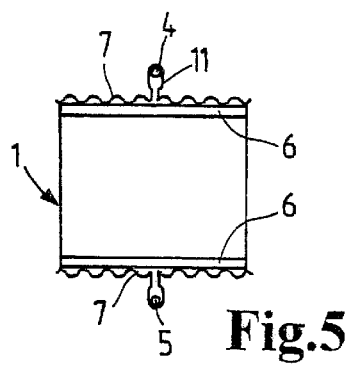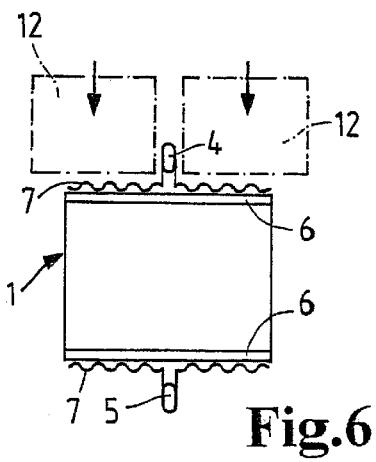

PIEZOELECTRIC ACTUATOR WITH IMPROVED ELECTRODE CONNECTIONS

PRIOR ART

The invention relates to a piezoelectric actuator, for example for actuating a mechanical component such as a valve or the like, according to the features contained in the preamble to the main claim.

It is generally known that using the so-called piezoelectric effect, a piezoelectric element can be constructed out of a material with a suitable crystalline structure. The application of an external electrical voltage causes a mechanical reaction of the piezoelectric element which, depending on the crystalline structure and the region to which the electrical voltage is applied, produces a compression or tension in a predictable direction. This piezoelectric actuator can be constructed of a number of layers (multilayered actuators), wherein the electrodes by means of which the electrical voltage is applied are respectively disposed between the layers.

Piezoelectric actuators of this kind can be provided, for example, to drive on-off valves in fuel injection systems in motor vehicles. During operation of the piezoelectric actuator here, particular care must be taken that mechanical stresses in the layer structure do not also cause undesirable fractures to form in the vicinity of the external connecting electrodes. Since the internal electrodes, which are each contacted on one side, are integrated into the layer structure in comb fashion, the electrodes disposed one after another in the direction of the layer structure must be respectively contacted in an alternating fashion on opposite sides from one another. When the piezoelectric actuator is actuated, i.e. when a voltage is applied between the internal electrodes on opposite sides in the layer structure, different mechanical forces are produced in the vicinity of the internal electrodes as well as in the vicinity of the contacts on the external electrodes, which can lead to mechanical stresses and therefore to fractures in the external electrodes.

ADVANTAGES OF THE INVENTION

The piezoelectric actuator described at the beginning, which can be used, for example, to actuate a mechanical component, is advantageously modified by virtue of the fact that at least one layer of each respective external electrode is embodied as distributed in a net-like or woven cloth-like fashion on a respective side surface and is contacted at least at points by the respective internal electrodes. Between the contacts here, there is a respective expandable region and the electrical voltage is supplied by means of connections which likewise have expandable regions in the vicinity of the contact surface or between the contact points.

In a particularly preferred embodiment of the invention, as a first layer of the external electrode, a metal surface, for example, is disposed on a respective side surface which is contacted by the respective internal electrodes. As a second external electrode, the net-like or woven cloth-like layer is then placed upon the first layer, wherein it is contacted by the first layer at least at points and wherein an expandable region is disposed between the contacts in this instance as well. Here, too, the electrical voltage is then supplied by means of connections to the second external electrode, which likewise has expandable regions in the vicinity of the contact surface or between the contact points.

The net-like or woven cloth-like external electrodes are used to prevent lateral fractures which can arise from the inner electrodes due to delamination, as mentioned at the beginning. The net-like or woven cloth-like external electrodes can thereby be advantageously soldered in place only at points so that no large shearing stresses occur in the external electrodes during the expansion of the piezoelectric actuator, which can cause the electrodes to fracture.

In a modified embodiment, the connections for the electrical voltage can be produced by means of a solder contact which is disposed in a region of the layer structure of the piezoelectric actuator which does not have any active longitudinal expansion because the internal electrodes do not extend to the edge of the piezoelectric actuator.

In another embodiment, the connections for the electrical voltage can be advantageously produced by means of a soldered, welded, or crimped contact which is disposed in a folded region of the net-like or woven cloth-like external electrode. In this case, it is possible that the connections are produced by means of a flat wire which is disposed inside the folded region.

It is also possible that the connections for the electrical voltage are produced by means of a wire which is disposed linearly in the folded region that extends the entire length of the piezoelectric actuator or also by means of a wire that is laterally or perpendicularly wavy and a soldered, welded, or crimped contact, which is disposed at points on the woven cloth-like external electrode.

Furthermore, the connections for the electrical voltage can also be respectively produced by means of a comb electrode and a soldered or welded contact which is disposed at points on the preferably elastic combs and on the second external electrode.

These and other features of preferred modifications of the invention ensue not only from the claims but also from the specification and the drawings, wherein the individual features can be respectively realized singly or multiply in the form of sub-combinations in the embodiment of the invention and in other areas and can represent advantageous and intrinsically patentable embodiments which are claimed herein.

DRAWINGS

Exemplary embodiments of the piezoelectric actuator according to the invention will be explained in conjunction with the drawings.

FIG. 1 is a section through a piezoelectric actuator that has a multilayered structure of piezoelectric ceramic layers and internal electrodes and has a net-like external electrode on a first flat external electrode;

FIG. 2 is a top view of the net-like external electrode according to FIG. 1, with the connections for an electrical voltage;

FIG. 3 is a detailed section through the layer structure in the vicinity of the electrical connections;

FIG. 4 shows a modification of the embodiment according to FIG. 3, with electrical connections disposed in the folded region;

FIG. 5 shows a modification of the embodiment according to FIG. 4, with a connecting wire disposed in the folded region;

FIG. 6 shows an exemplary embodiment in which the net-like external electrode is connected to the first external electrode by means of bracket solders;

Figure 9:
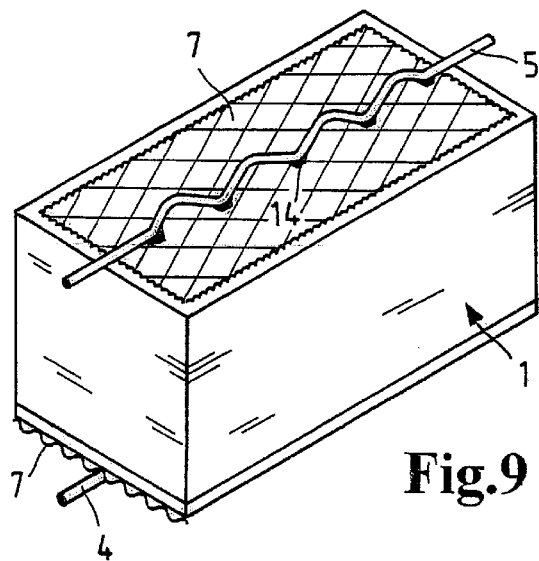
Figure 10:
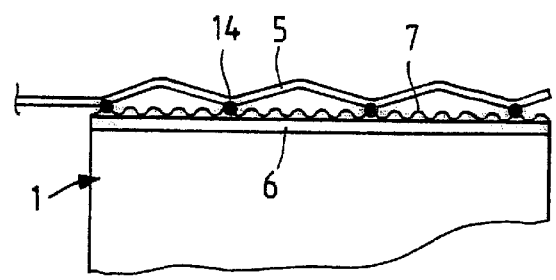
Figure 11:
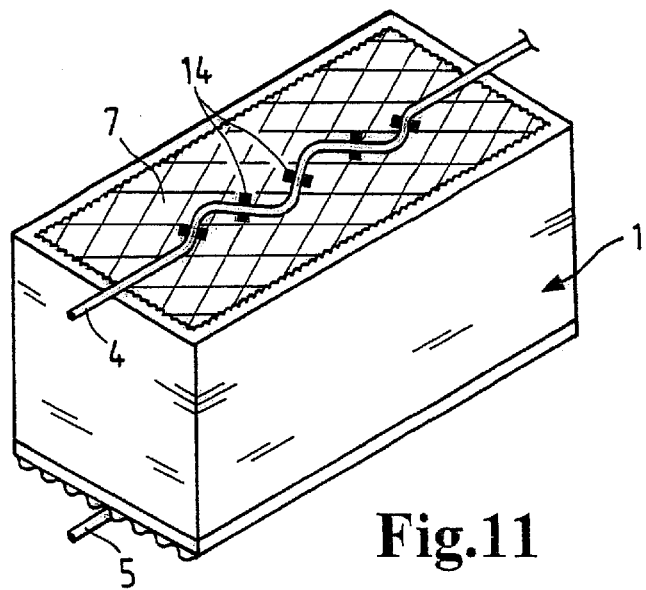
Figure 12:
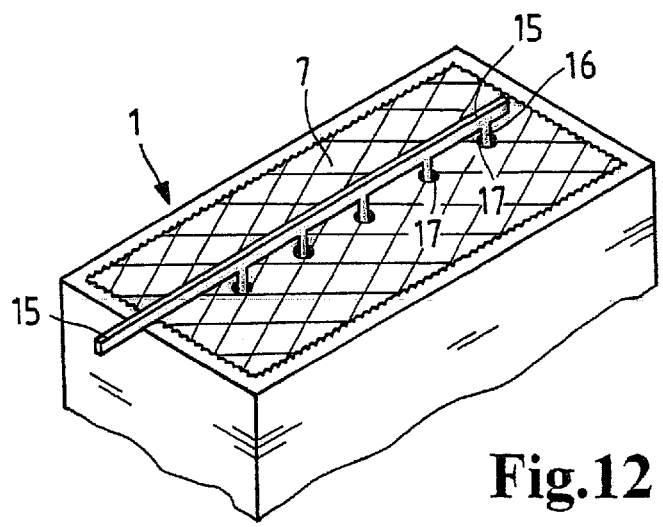
Figure 13:
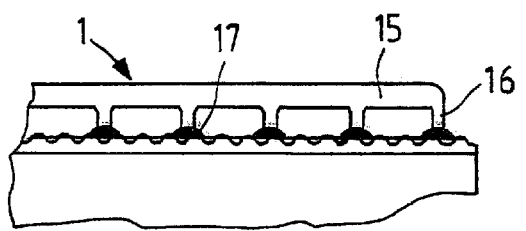

FIGS. 9, 10, and 11 respectively show views of a wavy connecting wire for the electrical connections, and FIGS. 12 and 13 show two views of a comb-like electrical connecting wire.

DESCRIPTION OF THE EXEMPLARY EMBODIMENTS

FIG. 1 shows a piezoelectric actuator 1 which is comprised in an intrinsically known manner of piezoelectric foils of a ceramic material with a suitable crystalline structure so that that using the so-called piezoelectric effect, the application of an external electrical voltage to internal electrodes 2 and 3 by means of electrical connections 4 and 5 causes a mechanical reaction of the piezoelectric actuator 1. FIG. 2 is a side view of this device and FIG. 3 is a sectional view in the vicinity of the connecting wires 4 and 5.

The internal electrodes 2 and 3 contact a first flat external electrode 6, which is in turn contacted by a second net-like external electrode 7 by means of point contacts 8, for example by means of soldering or welding. The first external electrode 6 can be a thin layer, for example a few $\mu$m thick, made of Ni, Ni+Cu, or Ni+PbSn, which adheres directly to the surface of the piezoelectric actuator 1. The connecting wires 4 and 5 are connected to the net-like external electrode 7 at a contact point 9 by means of soldering or welding. In order to prevent wear on the soldering point 9, a passive foot region 10 is provided in the piezoelectric actuator 1 according to FIG. 1, in which the internal electrodes 2 and 3 do not extend to the external electrodes 6 and 7, and therefore no mechanical reactions due to the piezoelectric effect occur in this foot region. The disadvantages due to a possible fracture formation mentioned in the introduction to the specification are thereby prevented in the foot region 10.

FIG. 4 shows an exemplary embodiment in which a region of the external electrode 7 is folded for the fastening of the connecting wire 4 or 5 and as a result, the soldering point 9 is prevented from stiffening and thereby fractures are prevented from forming. By means of a height h, an elastic folded region 11 is consequently produced in which the piezoelectric actuator 1 can expand without being prevented by the stiffening connecting wire 4 or 5. It would be particularly advantageous here to weld the connecting wire 4 or 5 in place since as a result, no solder can flow over the distance h, which could otherwise lead to a stiffening. A passive foot region of the kind provided in FIGS. 1 to 3 is no longer necessary here.

FIG. 5 shows a modification of the exemplary embodiment according to FIG. 4 in which the respective connecting wire 4 or 5 is welded in place inside the folded region 11.

In the exemplary embodiment from FIG. 6, a flat connecting wire 4 or 5 is provided, which is welded in place on the inside and whose narrow width makes it possible for a bracket soldering of the net-like external electrode onto the first external electrode to be produced by means of heating plates 12.

Figure 7:
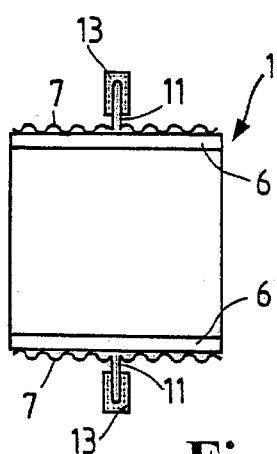
FIG. 7 shows an exemplary embodiment in which the net-like external electrode is connected to the connecting wire by means of crimps.

FIG. 7 shows an embodiment in which the respective connecting wire 4 or 5 is a crimped strip 13 that is placed over the folded region 11.

Figure 8:
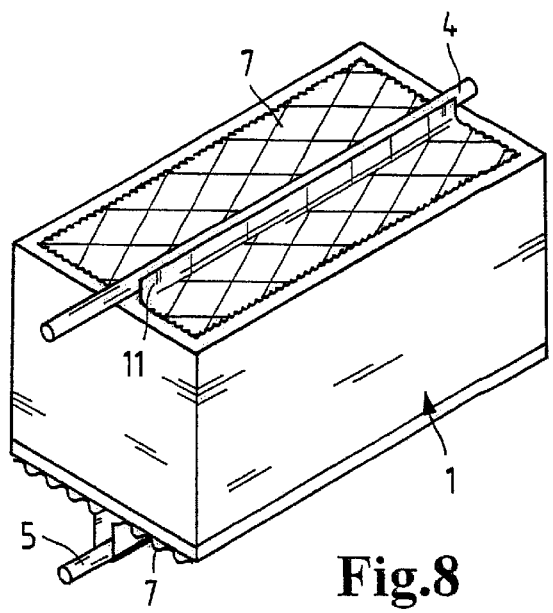
FIG. 8 shows an exemplary embodiment in which the net-like external electrode is connected to the external electrode in a folded region along the entire length of the piezoelectric actuator by means of bracket solders or crimps.

FIG. 8 shows a modification of the fastening of the connecting wires 4 and 5 in which a continuous wire is placed the entire length of the piezoelectric actuator 1. A local soldering or welding to the fold 11 prevents the occurrence of fatigue fractures between the wires 4 or 5 and the respective external electrode 7 in this instance as well.

In the exemplary embodiment according to FIG. 9 and FIG. 10, the connecting wires 4 and 5 are wavy, thus reducing a hindrance to the expansion of the external electrode 7. The wires 4 and 5 are welded or soldered to a number of small points 14 in the longitudinal direction of the piezoelectric actuator 1. According to FIGS. 9 and 10, the wires 4 and 5 are waved perpendicular to the plane of the external electrode 7 so that here, too, it is possible to perform the bracket soldering mentioned in conjunction with FIG. 6 for soldering the net-like external electrode 7 to the piezoelectric actuator 1 or to the first flat external electrode 6 without significant hindrance. The wire 4 or 5 previously welded to the external electrode 7 can be used for securing and centering during the bracket soldering.

FIG. 11 shows a wavy connecting wire 4 or 5 that is soldered or welded in a flat fashion to the net-like external electrode 7. Here, too, a spot contacting is executed at points 14, which does not hinder the expandability of the external electrode 7. The bracket soldering of the external electrode can also be carried out here, the easiest time for this being once the respective connecting wire 4 or 5 has been put in place.

FIGS. 12 and 13 show another exemplary embodiment in which a special form of a connecting wire 15 is mounted in place, in which elastic feet 16 are provided, which extend in comb-fashion to contact points 17 at which they are soldered or welded to the respective external electrode 7.

What is claimed is:

1. A piezoelectric actuator, comprising:

a multilayered structure of piezoelectric layers and electrodes (2, 3) disposed between them;

an alternating lateral contacting of the internal electrodes (2, 3) by means of external electrodes (6, 7) via which an electrical voltage can be supplied, wherein an external electrode (7), which is distributed in a net-like or woven cloth-like fashion and mounted on a respective side surface and which is contact at least at points by the respective internal electrodes (2, 3), and an expandable region is disposed between the contacts, and wherein the electrical voltage is supplied by means of connections (4, 5; 13; 15), which likewise have expandable regions between the regions of the contact surface or contact points (8; 14; 17) and/or which are disposed in elastic folded regions (11) of the external electrode (7), said folded regions (11) extending by a distance (h) from an outer surface of said external electrode.

2. The piezoelectric actuator according to claim 1, characterized in that as a first external electrode (6) a conducting surface is mounted on a respective side surface which is contacted by the respective internal electrodes (2, 3) and the second net-like or woven cloth-like external electrode (7) is disposed on the first external electrode (6), wherein the second external electrode is contacted by the first one (6) at least at points, and wherein the expandable region is disposed between the contacts (8; 14; 17).

3. The piezoelectric actuator according to claim 1, characterized in that the connections (4, 5) for the electrical voltage are produced by means of a soldered contact (9), which is disposed in a region (10) of the layer structure of the piezoelectric actuator (1) which experiences virtually no longitudinal expansion because the internal electrodes (2, 3) do not extend to the edge of the piezoelectric actuator (1).

4. The piezoelectric actuator according to claim 1, characterized in that the connections (4, 5; 13) for the electrical voltage are produced by means of a soldered, welded, or crimped contact, which is disposed in the folded region (11) of the second external electrode (7).

5. The piezoelectric actuator according to claim 4, characterized in that the connections for the electrical voltage are produced by means of a flat wire (4, 5) which is disposed inside the folded region (11).

6. The piezoelectric actuator according to claim 4, characterized in that the connections for the electrical voltage are produced by means of a wire (4, 5), which extends over a folded region (11) running the entire length of the piezoelectric actuator (1).

7. The piezoelectric actuator according to claim 1, characterized in that the connections for the electrical voltage are each produced by means of a laterally or perpendicularly wavy wire (4, 5) and a soldered, welded, or crimped contact (14), which is disposed at points on the second external electrode (7).

8. The piezoelectric actuator according to claim 1, characterized in that the connections for the electrical voltage are produced by means of a comb-like wire (15) and a soldered or welded contact (17) each of the elastic comb tips (16) meets the second external electrode (7).

* * * * *